(12) United States Patent
Kaneko et al.

(10) Patent No.: US 6,624,492 B2
(45) Date of Patent: Sep. 23, 2003

(54) SEMICONDUCTOR CIRCUIT DEVICE HAVING GATE ARRAY AREA AND METHOD OF MAKING THEREOF

(75) Inventors: Yoshio Kaneko, Chiba-ken (JP); Yoshihisa Tamura, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/106,103

(22) Filed: Mar. 27, 2002

(65) Prior Publication Data

US 2002/0153609 A1 Oct. 24, 2002

(30) Foreign Application Priority Data

Mar. 27, 2001 (JP) ........................................ P2001-090461

(51) Int. Cl.⁷ .............................................. H01L 31/00
(52) U.S. Cl. ..................... 257/448; 257/296; 257/443
(58) Field of Search ............................... 257/296, 443, 257/448

(56) References Cited

U.S. PATENT DOCUMENTS 5,915,025 A * 6/1999 Taguchi et al.
6,054,872 A 4/2000 Fudanuki et al. ............. 326/39
6,304,100 B1 * 10/2001 Kobayashi

* cited by examiner

*Primary Examiner*—Fetsum Abraham
(74) *Attorney, Agent, or Firm*—Finnegan, Henderson, Farabow, Garrett & Dunner, L.L.P.

(57) ABSTRACT

A semiconductor integrated circuit having gate array area and IP (Intellectual Property) portion. A semiconductor integrated circuit has a lower wiring region and an upper wring region on a semiconductor substrate. A gate array region is on the semiconductor substrate. An IP (Intellectual Property) region comprises a plurality of semiconductor devices formed on the semiconductor substrate and has a predetermined function. A first wiring layer is in the lower layer wiring region above the semiconductor substrate and a second wiring layer is above the IP region. A third wiring layer is in the upper wiring region of the gate array region. The third wiring layer is wider than the first and second wiring layers.

19 Claims, 6 Drawing Sheets

SEMICONDUCTOR CIRCUIT DEVICE HAVING GATE ARRAY AREA AND METHOD OF MAKING THEREOF

CROSS REFERENCE RELATED APPLICATIONS

This application claims the benefit of priority from prior Japanese Patent Application P2001-90461 filed on Mar. 27, 2002; the contents of which are incorporated by reference herein.

FIELD OF THE INVENTION

The present invention relates to a gate array type semiconductor integrated circuit having so-called IP (IP: Intellectual Property) and a manufacturing method of the same.

BACKGROUND OF THE INVENTION

Recent ASIC (Application Specific Integrated Circuit) products is have increased processing speed as well as increased circuit size. LSIs have a large scale and can be fabricated in a large scale, in the system design, the design of formality for well used circuits is standardized, and a product specification as IP, which describes a function and a performance, and a circuit constitution are determined.

Since any IP obtained market advantage, for improved performance, designers look the most advanced semiconductor process technology. Although the system design in a realized with dedicated LSI storing the IP, the demand of system designers to use the IP in ASIC products becomes significant when the IP is generalized. This is because the LSIs are collectively integrated on one chip by adopting the ASIC. Thus lessening the number of parts and allowing microfabrication and low cost.

Dmands of users using the ASIC increases and further realization of circuits which are low in cost and show a high speed operation and high performance comes to be desired. The ASIC may inclined an embedded array and a standard. Since the IP is often the most advanced product that can be realized by use of the, difficulty of realization with the ASIC occurs. For example, the difficulty is a high speed operation of a large scale circuit. In the gate array, a wafer in which transistors are arranged regularly is first prepared, and Al wirings connecting the transistors respectively are connected so as to meet the demands of customers. However, when it is intended to realize a large scale circuit, many gate scales are necessary, and the circuit itself becomes large. The wiring in the large scale circuit IP becomes long due to the large circuit, and high speed operation becomes difficult.

An embedded array and a standard cell may also be used. These methods are the same as that to design individual LSIs in accordance with a necessary function of the IP. In these methods, a development of an IP circuit is made to confirm an evaluation, and design data thereof is registered previously in a computer. Then, when a request for utilization of the IP is made by the customer, the foregoing registered data is directly down-loaded on the corner of a chip of the embedded array LSI or the standard cell LSI, and a mask is designed. In this case, since the design of the arrangement of the IP is individually made in accordance with a necessary function, the function required is satisfied. However, a size and an arrangement of each transistor that is a constituent component, and wirings among the transistors are peculiar to the IP.

Accordingly, when the IP is used in the embedded array and the standard cell, all of the masks necessary for the LSI formation are necessary for each circuit demanded by the customer.

Any, jump in price of a photomasks because of microfabrication of a new semiconductor process is also potential problem. IF the wiring width is large in the photomask of the old process, then the IP cannot be formed, resulting in a jump in development cost of each product. A method to control the development cost is thorough using FPGA (Field Programmable Gate Array) is effective. However, since the FPGA loads a memory, the FPGA generally has a lower speed and a lower integration degree. An FPGA shows a processing speed lower by a several fraction of that of the gate array and requires a chip area several times as wide as that of the gate array. The FPGA has much difficulty to cope with the increase in the development cost than the gate array. Under such circumstances, it is desired to realize an ASIC circuit capable of loading low cost, high speed and high performance IPs.

SUMMARY OF THE INVENTION

According to an aspect of the present invention, a semiconductor integrated circuit having a lower wiring region and an upper wring region on a semiconductor substrate, said semiconductor integrated circuit comprising: the semiconductor substrate; a gate array region formed on the semiconductor substrate described above; an IP (Intellectual Property) region constituted by a plurality of semiconductor devices formed on the semiconductor substrate, the IP region having a predetermined function; a first wiring layer formed in the lower layer wiring region on the semiconductor substrate; a second wiring layer formed in the IP region; and a third wiring layer formed in the upper wiring region of the gate array region, wherein the third wiring layer is wider than the first and second wiring layers.

According to other aspect of the present invention, in a method of forming a semiconductor integrated circuit, said method of making semiconductor integrated device comprising: a step for forming a plurality of semiconductor devices respectively in first and second regions of a semiconductor substrate; a step for forming a gate array portion in the first region by forming a plurality of first wirings respectively connected to the plurality of semiconductor devices formed in the first region and for forming at least one IP (Intellectual Property) region having a predetermined function in the second region by forming a plurality of second wirings connecting the plurality of semiconductor devices to each other formed in the second region; and a step for forming a plurality of third wirings connecting the plurality of first wirings to each other, and the plurality of first wirings and the plurality of second wirings.

Other objects, features, and advantages of the present invention will become apparent from the following detailed description. It should be understood, however, that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

A more complete appreciation of the present invention and many of its attendant advantages will be readily obtained by reference to the following detailed description considered in connection with the accompanying drawings, in which.

DETAILED DESCRIPTION OF THE PREFERRED EMBODIMENTS

The present invention will be described by embodiments with reference to the drawings.

Figure 1:
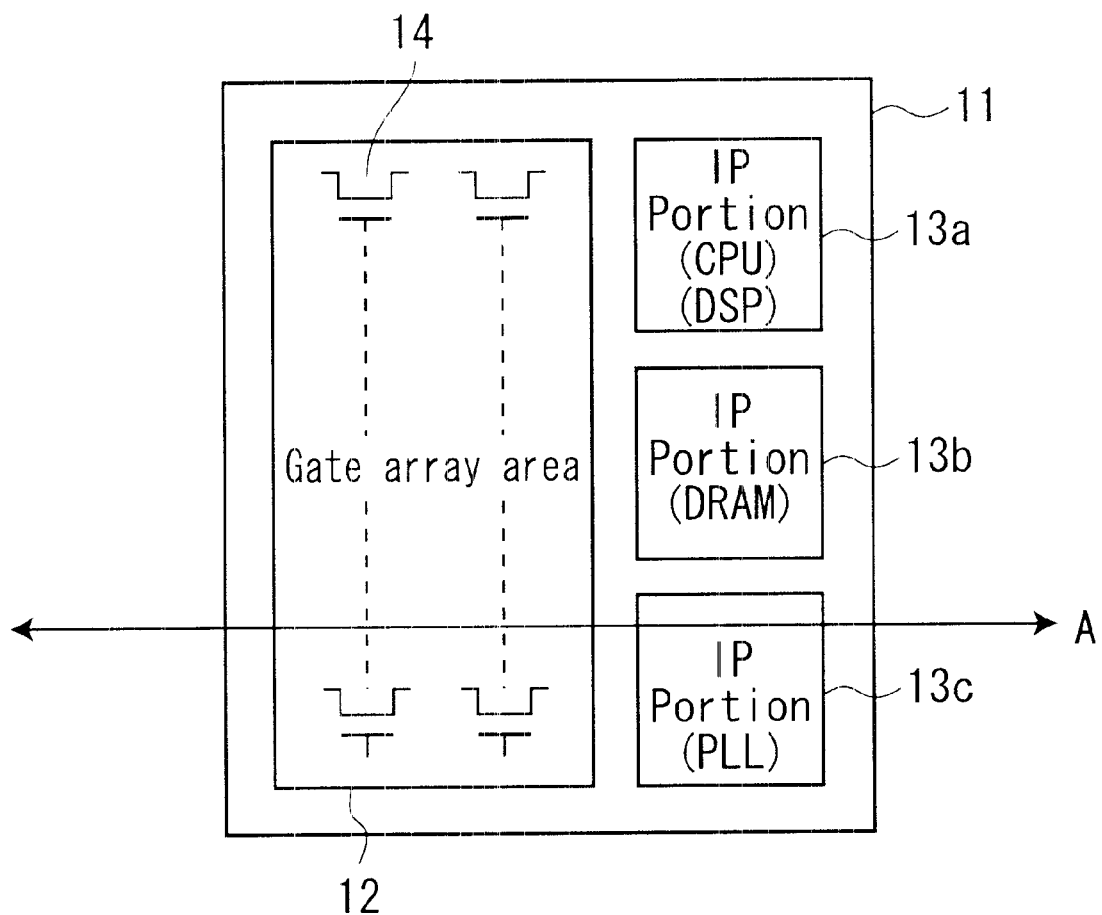
FIG. 1 is a plan view of a semiconductor integrated circuit device according to an embodiment of the present invention.

FIG. 1 is a plan view of a gate array type semiconductor integrated circuit device according to an embodiment of the present invention. A gate array portion 12 and a plurality of IP portions 13a to 13c arranged so as to be adjacent to the gate array portion 12 are formed in a semiconductor chip 11. A plurality of transistors 14 are formed in the gate array portion 12 so as to cover the gate array portion 12. A circuit having a function selected by users is constructed by connecting the plurality of transistors 14 with wirings in a sequent step.

Each IP portion 13a to 13c has a plurality of transistors and a plurality of wirings connecting these transistors to each other. Each IP portion is a hardware block having a predetermined characteristic and a predetermined function. A system LSI is constituted by properly combining a circuit constituted in the gate array region 12 with the plurality of IP portions 13a to 13c. These IP portions 13 are circuits, for example, a CPU (Central Processing Unit) or a DSP (Digital Signal Processor) 13a, a DRAM (Dynamic Random Access Memory) 13b, a PLL (Phase Locked Loop) 13c and the like.

Circuits which have been already designed and have usage achievement is used for each of the plurality of IP portions 13a to 13c characteristic and performance of each of the transistors on the chip are substantially identical even if they are loaded on different semiconductor integrated circuits.

In the semiconductor integrated circuit with such a constitution, after source/drain diffusion layers of the transistor and a gate electrode thereof and a lower layer wiring region of a wafer forming a low-layered wiring are formed, signal wirings for connecting the transistors 14 in the gate array portion 12, signal wirings for connecting the gate array portion 12 and IP portions 13 to be used among the plurality of IP portions 13a to 13c, and a power source wiring are formed. Thus, the semiconductor integrated circuit device is made so as to possess desired functions. Note that, for example, Al wiring and Cu wiring are used as each of the foregoing wirings.

Figure 2:
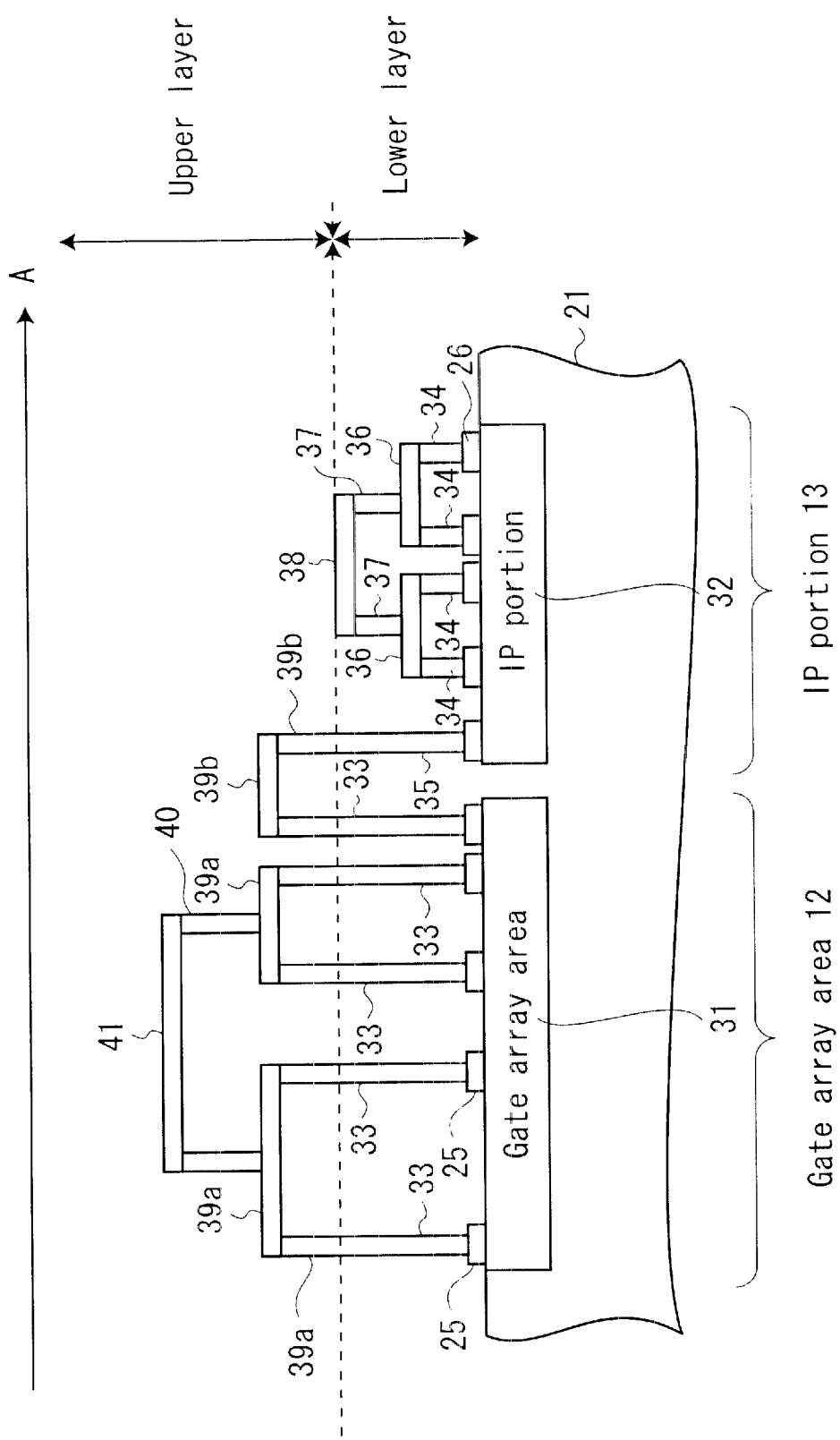
FIG. 2 is a an sectional view of the semiconductor integrated circuit device along the line A of FIG. 1.

FIG. 2 is a sectional view of the semiconductor integrated circuit device of FIG. 1 obtained by cutting the semiconductor integrated circuit device along the section line A, in which signal wirings for connecting a gate array region 31 and an IP region 32 are illustrated. A semiconductor substrate 21 corresponds to the semiconductor chip 11 of FIG. 1. Source/drain diffusion layers of a plurality of transistors 25 and gate electrodes thereof are formed in the region 31 constituting the gate array portion 12 of the semiconductor substrate 21. Moreover, in the region 32 constituting the plurality of IP portions 13 of the semiconductor substrate 21, source/drain diffusion layers of a plurality of transistors 26 and gate electrodes thereof are formed. Note that the IP portion 13 indicates a region in which the plurality of IP portions 13a to 13c are collectively formed.

IP As shown in FIG. 2, the 8 wring layers above the substrate 21 are divided into a lower-layer wiring region and an upper-layer wiring region. Although FIG. 2 shows a straight, horizontal line between the lower-layer and the upper layer, the divided point deose not have to be a liner or horizontal, the lower-layer is characterized by a second, Different design rule.

In the lower-layered wiring region above the region 31, formed are a plurality of wirings 33 connected to the source/drain diffusion layers of the plurality of transistors 25 and the gate electrodes thereof. These wirings 33 are formed so as to extend toward the perpendicular direction relative to the surface of the semiconductor substrate 21.

In the lower-layered region above the region 32, formed are a plurality of wirings 34 connected to the source/drain diffusion layers of the plurality of transistors 26 and the gate electrodes thereof. These Al wirings 34 are also formed so as to extend in the perpendicular direction to the surface of the semiconductor substrate 21. Moreover, in the low-layered wiring region above the region 32, formed are a plurality of wirings 35, which are connected to various kinds of signal nodes of the plurality of IP portions 13 and to the gate array portion 12. Note that only one wiring 35 is illustrated in FIG. 2. These wirings 35 are also formed so as to extend in the perpendicular direction to the surface of the semiconductor substrate 21. In the low-layered wiring region above the region 32, formed are a plurality of wirings 36 connecting optional wirings among the plurality of Al wirings 34. These Al wirings 36 are formed so as to extend in the horizontal direction relative to the surface of the semiconductor substrate 21. In the low-layered wiring region above the region 32, formed are a plurality of wirings 37 connected to optional wirings among the plurality of wirings 36. These wirings 37 are formed so as to extend toward the perpendicular direction to the surface of the semiconductor substrate 21. In the low-layered wiring region on the foregoing region 32, formed are a plurality of wirings 38 connecting optional wirings among the plurality of wirings 37. Note that only one wiring 38 is illustrated in FIG. 2. These wirings 38 are formed so as to extend in the parallel direction relative to the surface of the semiconductor substrate 21.

Herein, the source/drain diffusion layers of each transistor, the gate electrodes thereof, and the wirings 33 to 38 formed in the regions 31 and 32 and the low layered wiring region thereon are formed in common to all products by base layer steps for a wafer. Then, before receiving an order from an user, a wafer for which the base steps are finished is previously prepared. Note that in the plurality of IP portions 13a to 13c, circuits having predetermined functions such as the foregoing CPU, DSP, DRAM, and PLL circuits are formed by forming the foregoing wirings 34 to 38. Since the IP is required to perform a high speed operation and to be highly integrated ordinarily, the devices and the wirings must be microfabricated, so that the IP is designed by the most advanced process (smallest design rule) in many cases. Therefore, the gate array portion in the low-layered wiring region must be formed in the similar process.

Using of the semiconductor substrate 21 subjected to the base layer steps described above, that is, by use of the base layer wafer and the wirings in the low-layered wiring region, original wirings are formed for each product based on user's specification, thus preparing a system LSI. The system LSI is completed by forming an upper-layered wiring region in the base layer wafer in which the low-layered wiring layer is formed. Moreover, formation of the upper-layered wiring layer will be described hereinbelow.

In the upper-layered wiring region above the region 31, formed are a plurality of wirings 39a connecting optional wirings among the plurality of Al wirings 33. These wirings 39a are formed so as to extend in the parallel direction and the perpendicular direction relative to the surface of the semiconductor substrate 21. In this embodiment the wiring 39a is including a parallel portion and perpendicular portion to the surface of the semiconductor substrate 21. A plurality of wirings 39b is formed so as to stride the foregoing regions 31 and 32. The wirings 39b connect optional wirings among the plurality of wirings 33 and optical wirings among the plurality of wirings 35. Note that only one wiring 39 is illustrated in FIG. 2. These wirings 39b are formed so as to extend in the parallel and the perpendicular direction relative to the surface of the semiconductor substrate 21. In this embodiment, the wiring 39a has parallel portion and perpendicular portion to the surface of the semiconductor substrate 21. Above the region 31, a plurality of wirings 40 are formed, which are connected to optional wirings among the wirings 39. These wirings 40 are formed so as to extend in the perpendicular direction relative to the surface of the semiconductor substrate 21. Above the region 31, a plurality of wirings 41 are formed, which connect the wirings 40 to each other. Note that only one wiring 41 is illustrated in FIG. 2. These wiring 40 is formed so as to extend in the parallel direction to the surface of the semiconductor substrate 21.

By forming the foregoing wirings 39 to 41, connections of a plurality of transistors in the gate array portion 12 are made, and the original system LSI having functions based on a user's specification is formed in the gate array portion 12. At the same time, the gate array portion 12 and the plurality of IP portions 13 are coupled to each other.

Specifically, the IP portion 13 includes the wirings 34 and 37 extended in the perpendicular direction relative to the surface of the substrate21 and the wirings 36 and 38 extended in the horizontal direction relative to the surface of the substrate21. The gate array portion 12 includes the wirings 33 and 40 extended in the perpendicular direction relative to the surface of the substrate21 and the wirings 39 and 41 extended in the horizontal direction relative to the surface of the substrate21. The wiring 36 of the IP portion 13 and the wiring 39 of the gate array portion 12 are respectively formed in the different wiring layers. Moreover, the wiring 38 of the IP portion 13 and the wiring 41 of the gate array portion 12 are respectively formed in the different wiring layers. The wirings 33, 34, 36, 37 and 38 are formed in the low-layered wiring layer, and the wirings 40 and 41 are formed in the upper-layered wiring layer.

The wirings 34, 36, 37 and 38 constituting the IP portion 13 are formed in the lower-layered wiring layer, and a part of the wirings 33 of the gate array portion 12 is formed in the lower-layered wiring layer. The wirings 39, 40 and 41 which are connected to each other in accordance with the user's specification are formed in the upper-layered wiring layer.

The wirings 33 and 34 formed in the lower-layered wiring layer have narrower wiring widths than the wirings 39 and 40 formed in the upper-layered wiring layer. Moreover, since a high speed operation is required in the IP portion, the IP portion has short wiring distances and is microprocessed.

Figure 3:
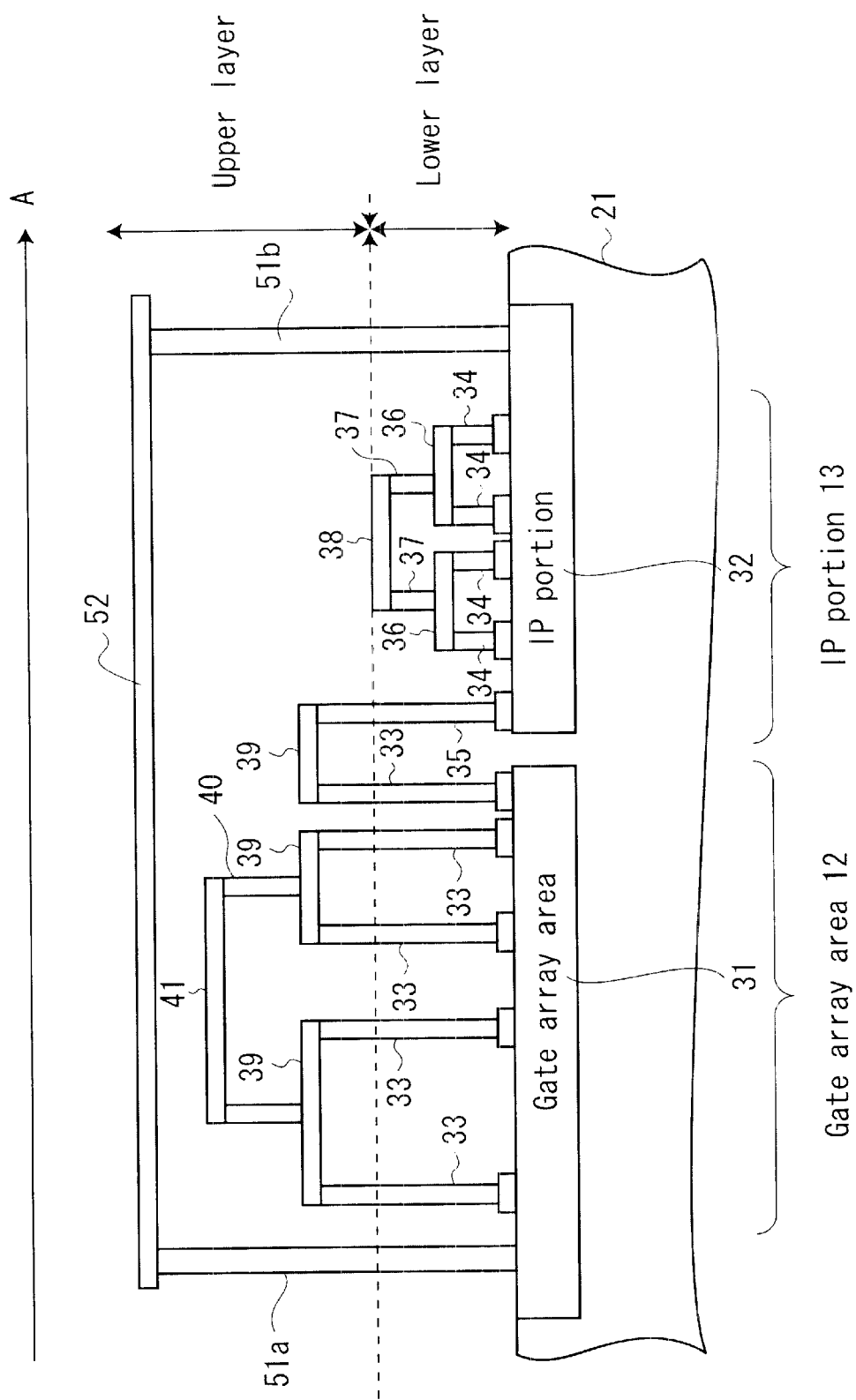
FIG. 3 is a sectional view of another semiconductor integrated circuit device according to an embodiment of the present invention.

FIG. 3 is a sectional view of a semiconductor integrated circuit device obtained by cutting a semiconductor integrated circuit device of FIG. 1 along the section plane A, signal wirings and a power source line for connecting a gate array region 31 and each IP region 32 are illustrated. The semiconductor substrate 21 corresponds to the semiconductor chip 11 of FIG. 1. Source/drain diffusion layers of a plurality of transistors 25 and gate electrodes thereof are formed in the region 31 of the semiconductor substrate 21 constituting the gate array portion 12. Source/drain diffusion layers of a plurality of transistors 26 and gate electrodes thereof are formed in the region 32 of the semiconductor substrate 21 constituting the plurality of IP portions 13. Note that the IP portion 13 indicates a region in which the plurality of IP portions 13a to 13c are collectively formed.

In FIG. 3, reference numeral 52 denotes a power source line, which is connected to wirings 51a and 51b connected to a power source node of the gate array region 31 and the IP region 32.

In this semiconductor integrated circuit device, the part of the wirings of the gate array portion 12 and the wirings of the IP portion 13 are previously formed in the lower-layered wiring layer above the semiconductor substrate 21, and the signal wirings 39, 40 and 41 and the power source wirings 51a, 51b and 52 are formed in the upper-layered wiring layer in accordance with user's specification. The signal wirings 39, 40 and 41 and the power source wirings 51a, 51b and 52 have wider wiring widths than those of the wirings 34, 36, 37 and 38 constituting the IP portion.

Figure 4:
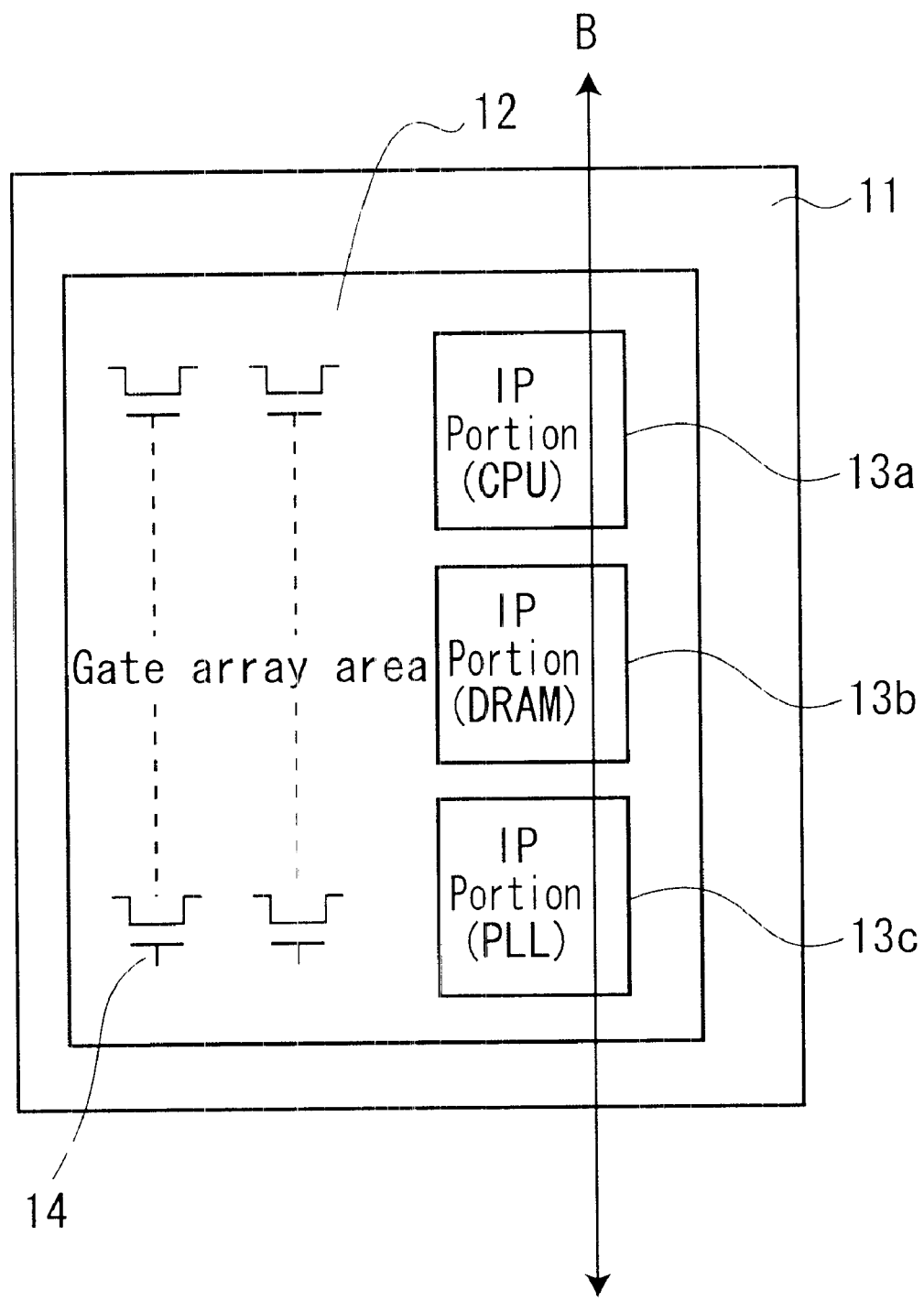
FIG. 4 is a plan view of a semiconductor integrated circuit device according to an embodiment of the present invention.

FIG. 4 shows another embodiment of the present invention, in which IP portions 13a to 13c are incorporated in the gate array portion 12. It is thus possible to utilize an element region more effectively than the embodiment of FIG. 1.

Figure 5:
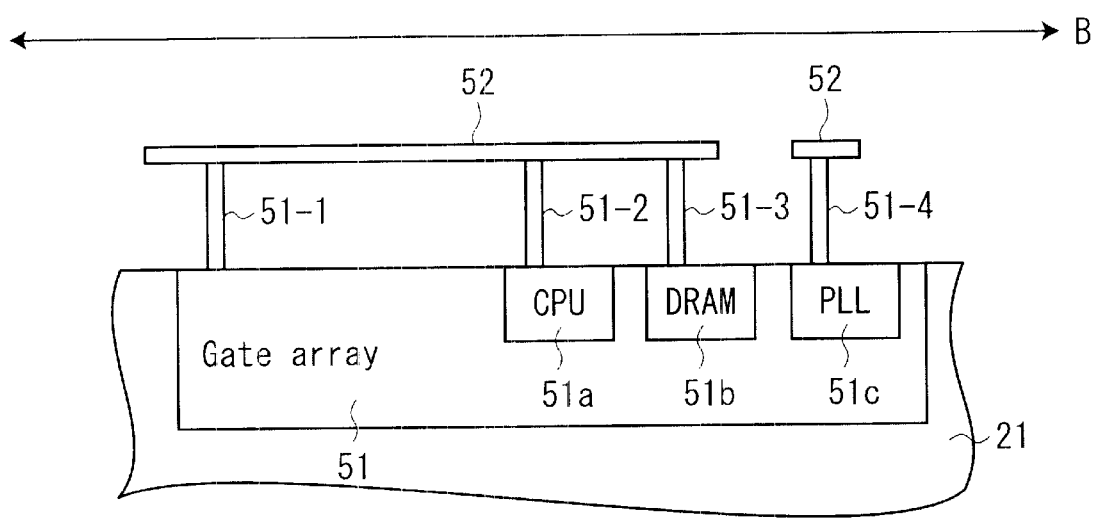
FIG. 5 is a sectional view of the semiconductor integrated circuit device along the line B of FIG. 4.

FIG. 5 is sectional view of the semiconductor integrated circuit obtained by cutting the semiconductor integrated circuit along the section plane B of FIG. 4.

A CPU 51, a DRAM 51b and a PLL circuit 51c are formed as the IP portion. When, for example, the PLL circuit 51c becomes unnecessary in constructing the circuit based on the user's specification, during a formation step of the power source wiring, the power source wiring 52 is formed in the state where the power source wiring 52 is connected to wirings 51-1 to 51-3 of the gate array region 51, the CPU 51a and the DRAM 51b. At the same time the power source wiring 52 is cut halfway so as not to be connected to a wirings 51-4 of the PLL circuit 51c. This power source wiring 52 is also formed during the foregoing upper layer step.

According to the foregoing embodiments, since the plurality of IP portions can be prepared in the state where they are previously formed on the wafer so as to have predetermined functions, it is satisfactory that the wirings of the gate array portion, the wiring between the gate array portion and the IP portion and the power source wiring are designed after receiving user's order and they are formed. Accordingly, the semiconductor integrated circuit including the IP portion based on the user's specification can be constructed within a relatively short period of time after receiving the user's order. In addition, the portion in which original circuits are formed based on the user's specification is constituted by the gate array portion 12. In this gate array portion, the plurality of transistors spread merely over the gate array portion. Therefore a circuit having the same function as the FPGA circuit can have a scale smaller than the FPGA, and a price as the semiconductor integrated circuit device becomes low.

In recent years, a microprocessed photomask has been also necessary in accordance with minute wafer manufacturing processes. This microprocessed photomask is costly, and the photomask must be made for each product such as the gate array of limited production and diversified production, resulting in a high cost. When processing precision is degraded, the photomask can be less expensive. However, if there is a circuit portion which operates at a high speed, it is impossible to make the photomask cheaply.

On the contrary, in the semiconductor integrated circuit device of the foregoing embodiments, the circuit portion such as the IP portion which operates at a high speed and the circuit portion such as the gate array portion which operates at a low speed are clearly separated, and the circuit portion operating at a high speed, that is, the IP portions 13 can be formed with the same design specification among the individual products which are respectively made with the different user's specification. Accordingly, the photomask used for forming the wirings 34 to 38 in the IP portion 13 shown in FIG. 2 may be satisfactorily made for each of all products by one set. In the lower-layered wiring layer, it is possible to use the common photomask having a small wiring width.

The wirings 34 to 38 in the IP portion 13 operating at a high speed are formed in the lower-layered wiring layer. Generally, when the lower-layered wiring layer is used, a wiring distance is short. As the wiring distance is shorter, the signal propagation is faster. Accordingly, the operation speed of the IP portion 13 can be made higher. Moreover, the wirings 36 and 38 in the IP portion 13 have smaller widths (narrower) than those of the wirings 39 and 41 in the gate array portion 12, and fine wirings are formed in the IP portion 13. Therefore, the IP portion 13 can be made compact-sized, and thus the operation speed of the IP portion 13 can be made higher. Though in order to form minute wirings as described above, a microprocessed photomask is necessary, it will do to prepare the photomask used in forming the wirings of the IP portion 13 for each of all products by one set as described above. Accordingly, an increase in cost is not accompanied with the preparation of the photomask.

On the other hand, the photomask for use in forming the upper-layered wiring necessary for each product manufactured based on the user's specification is used in the circuit portion such as the gate array portion which operates at a low speed. Therefore, it is satisfactory that processing precision of this photomask may be low. Since it is possible to manufacture the photomask with low cost and low processing precision, which is newly made based on the user's specification as described above, development expense can be reduced. The upper-layered wiring layer shown in FIG. 2 is the one based on the user's specification, and the cheap photomask with low processing precision can be used.

Furthermore, since it will do that the photomask required to be prepared for each product manufactured based on the user's specification may be manufactured with low processing precision, the yield of the photomask can be increased, and a period of time required to manufacture the photomask can be shortened. Accordingly, a period of time required to complete a sample product can be shortened.

Furthermore, before manufacturing products by performing upper layer steps based on the user's specification, the IP portion 13 influencing the yield of the wafer and operating at a high speed is tested previously after the base layer steps are finished. Thus, the IP portion 13 can sort defective wafers, and upper layer steps can be carried out only for sound wafers. Therefore, it is possible to increase the yield of the sample.

Figure 6:
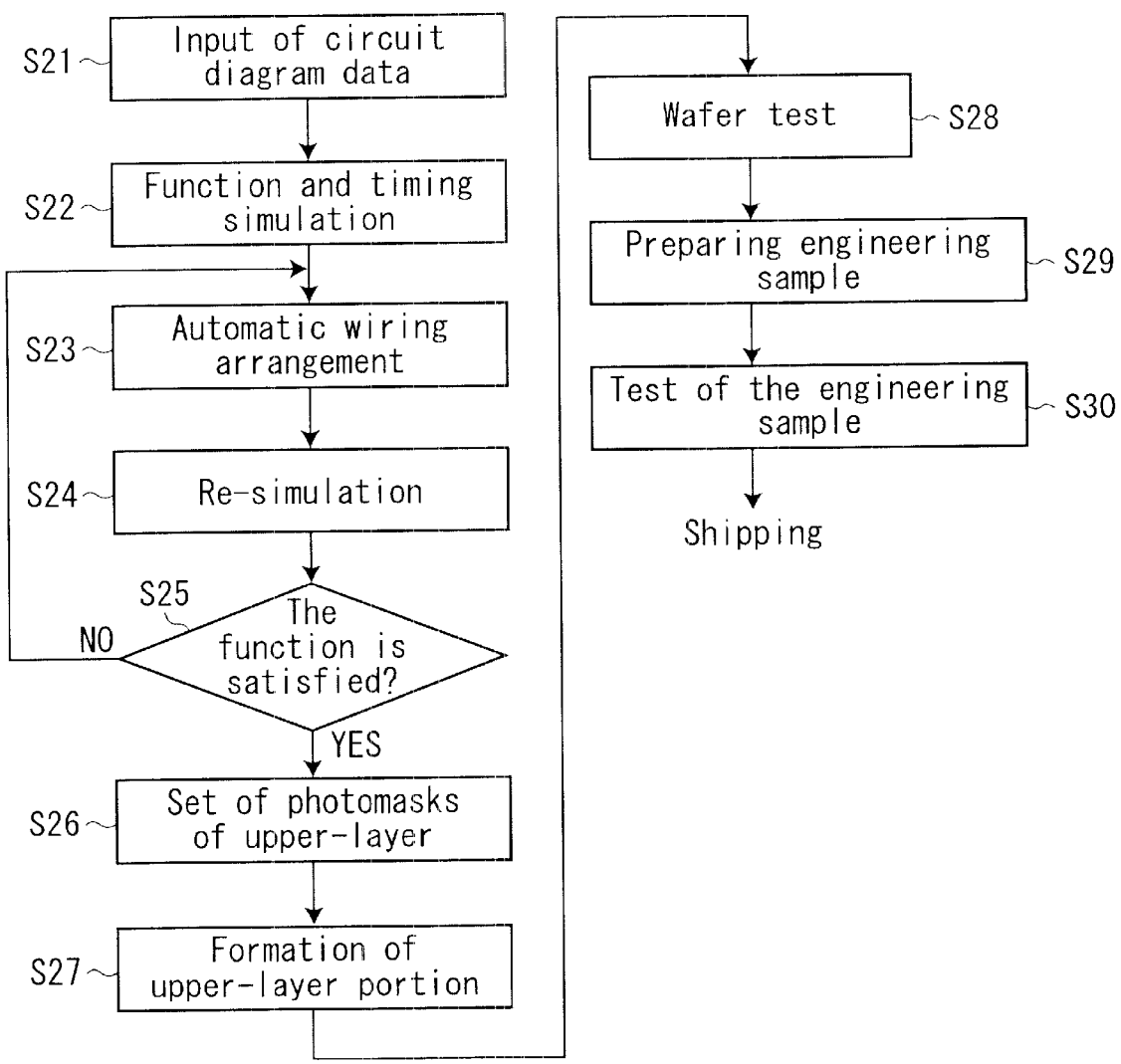
FIGS. 6 (a) and (b) are a flowchart showing an example of a method of making a semiconductor integrated circuit device according to an embodiment of the present invention.

Next, a method of manufacturing the semiconductor integrated circuit device of the present invention described above will be described with reference to a flowchart of FIGS. 6(a) and 6(b). FIG. 6(a) illustrates the flowchart corresponding to the base layer steps in FIG. 2. In step S11, a set of photomasks for use in the base layer steps are designed based on information concerning the design for forming the gate array portion and the IP (Intellectual Property) portion, which are previously registered in a computer. In the one set of photomasks for use in the base layer steps, included are various photomasks for executing the base layer steps for the wafer, such as,for example, a mask for oxidation, which is used for forming an element isolation insulating film, a mask for selective etching, which is used for patterning a gate electrode and a mask for selective etching, which is used for forming wirings.

Next, in step S12, various processings are performed for the wafer by use of the photomask for use in the base layer step, which was designed in step S11, and the formation of the semiconductor integrated circuit device is performed up to the stage shown as the lower-layered wiring step of FIG. 2 (preparation of the base layer wafer). Specifically, the plurality of transistors respectively having the source/drain diffusion layers and the gate electrodes are first formed in the regions 31 and 32 in FIG. 2, and further the wirings 34 to 38 are formed in the IP portion 13 in FIG. 2, thus forming the IP portion 13 having a predetermined function. Furthermore, when the foregoing wirings 34 to 38 are formed, the wiring 33 is formed also in the gate array portion 12. Then, the wafer for which the base layer steps are finished is previously prepared before receiving an user's order. Then when receiving the order from the user, the upper layer steps are performed for the wafer, and either the sample or the product is manufactured.

FIG. 6(b) illustrates the flowchart corresponding to the upper layer steps in FIG. 2. In step S21, circuit diagram data is input to the computer in response to a product based on a user's specification. Subsequently, in step S22, a function and a timing simulation based on the user's specification are executed on the computer. Usually, the user performs these two steps S21 and S22.

Next, in step S23, an automatic wiring arrangement design is performed by use of CAD based on the circuit diagram data, and results of the function and the timing simulation, which were input to the computer. Herein, since the IP portion 13 has been already formed in the base layer steps, a circuit change in the IP portion 13 is not made. However, the design for the supply of the power source to the IP portion 13, and the designs for arranging the wirings in the gate array portion 12 and for arranging the wiring connecting the gate array portion 12 and the IP portion 13 are performed.

Next, based on the data for the wiring arrangement designed in step S23, a verification with higher precision is performed in step S24 (re-simulation).

Next, in step S25, it is decided whether the function requested by the user is satisfied. If this function is not satisfied, the procedure returns to step S23, and the automatic wiring arrangement design is performed again. On the other hand, if this function is satisfied, the photomask for use in the upper layer steps is prepared based on the design data in step S26. Specifically, the photomask for forming the upper-layered wiring is prepared in response to the user's specification.

Next, in step S27, preparation of an upper portion of the wafer is performed using the photomask for forming the upper-layered wiring. The wirings 39 to 41 shown in FIG. 2 and the power source wiring 52 shown in FIG. 3 are formed.

Next, in step S28, it is decided whether the semiconductor integrated circuit device is defective or nondefective in a wafer stage (wafer test), and only the nondefective product is sent to the rear process. Subsequently, in step S29, an engineering sample is prepared, and housed in a package. Thus, the engineering sample can be mounted on a printed substrate, and a final sample test is performed in step S30 to perform the final test. Then, products which passed the test are shipped.

Incidentally, as conventional other technologies which construct the semiconductor integrated circuit device having desired functions, a standard cell and an embedded array have been known. In the standard cell and the embedded array, hard IP design data itself is previously registered in a computer for CAD design, and the design is performed by use of the data according to demand. However, since a photomask necessary for making a wafer is made in consideration of an original specification (custom specification) based on user's specification in any of the standard cell and the embedded array, the cost in the mask preparation more increases. This is because the standard cell and the embedded array have a common wiring width because of the custom specification and all of the masks must be formed by use of a mask for microprocessing.

On the contrary, in the method of the foregoing embodiment, the base layer steps performed until the gate array portion 12 and the IP portion 13 are formed are common to all of the final products, and the photomask necessary for performing the base layer steps may be prepared by one set for various user's specifications. In the upper layer steps, the photomask alone for forming the wiring in the gate array portion 12 and the wiring between the gate array portion 12 and the IP portion 13 may be designed, and prepared. Therefore, the number of the photomask that must be prepared based on the user's specification lessens compared to the standard cell and the embedded array. While there has been illustrated and described what are presently considered to be preferred embodiments of the present invention, it will be understood by those skilled in the art that various changes and modifications may be made, and equivalent may be substituted for devices thereof without departing from the true scope of the invention. In addition, many modifications may be made to adapt a particular situation or material to the teaching of the present invention without departing from the central scope thereof. Therefore, it is intended that this invention not be limited to the particular embodiments disclosed, but that the invention include all embodiments falling within the scope of the appended claims.

What is claimed is:

1. A semiconductor integrated circuit having a lower-layered wiring region and an upper-layered wiring region on a semiconductor substrate, said semiconductor integrated circuit comprising:
   a gate array region on the semiconductor substrate;
   an IP (Intellectual Property) region including a plurality of semiconductor devices on the semiconductor substrate;
   a first wiring layer in the lower-layered wiring region above the gate array region;
   a second wiring layer above the IP region; and
   a third wiring layer above the upper-layered wiring region of the gate array region,
   wherein the third wiring layer has a width larger than the first and second wiring layers.

2. The semiconductor integrated circuit device according to claim 1, wherein the second wiring layer is located below the third wiring layer toward the semiconductor substrate.

3. The semiconductor integrated circuit device according to claim 1, wherein the second wiring layer comprises a plurality of wiring layers.

4. The semiconductor integrated circuit device according to claim 1, wherein the IP region has a memory region.

5. The semiconductor integrated circuit device according to claim 1, wherein the IP region has a DSP (Digital Signal Processor) region.

6. The semiconductor integrated circuit device according to claim 1, wherein the IP region has a CPU region.

7. The semiconductor integrated circuit device according to claim 1, wherein the third wiring layer is a wiring layer connecting the gate array region to the other gate array cells.

8. The semiconductor integrated circuit according to claim 1, wherein a part of the first wiring layer connects the gate array region and the IP region.

9. A semiconductor integrated circuit having a lower-layered wiring region and an upper-layered wiring region on a semiconductor substrate, said semiconductor integrated circuit comprising:
   a gate array region formed on the semiconductor substrate;
   an IP (Intellectual Property) region including a plurality of semiconductor devices on the semiconductor substrate and having a predetermined function;
   a first wiring layer in the lower-layered wiring region above the gate array region;
   a second wiring layer above the IP region;
   a third wiring layer in the upper-layered wiring region above gate array region; and
   a fourth wiring layer between the gate array region and the IP region,
   wherein the third and fourth wiring layers have widths larger than the first and second wiring layers.

10. The semiconductor integrated circuit device according to claim 9, wherein the fourth wiring layer is a power source wiring, and supplies power to the gate array region and the IP region.

11. The semiconductor integrated circuit device according to claim 9, wherein the fourth wiring layer is a power source wiring, and supplies power to a part of the gate array region and the IP region.

12. The semiconductor integrated circuit device according to claim 9, wherein the second wiring layer is located below the third wiring layer toward the semiconductor substrate.

13. The semiconductor integrated circuit device according to claim 9, wherein the second wiring layer is comprises a plurality of wiring layers.

14. The semiconductor integrated circuit device according to claim 9, wherein the IP region has a memory region.

15. The semiconductor integrated circuit device according to claim 9, wherein the IP region has a DSP (Digital Signal Processor) region.

16. The semiconductor integrated circuit device according to claim 9, wherein the IP region has a CPU region.

17. The semiconductor integrated circuit device according to claim 9, wherein the third wiring layer is a wiring layer connecting the gate array region to the other gate array cells.

18. The semiconductor integrated circuit according to claim 9, wherein a part of the first wiring layers connects the gate array region and the IP region.

19. A method of making a semiconductor integrated circuit device, comprising:

forming a gate array region comprising a plurality of semiconductor device in a first region of a semiconductor substrate;

forming a plurality of first wirings connected to the plurality of semiconductor devices formed in the first region;

forming at least one IP (Intellectual Property) region comprising a plurality of semiconductor device in a second region of the semiconductor substrate;

forming a plurality of second wirings connecting the plurality of semiconductor devices formed in the second region, the IP region having a predetermined function; and forming a plurality of third wirings connecting the plurality of first wirings to each other, the third wirings being wider than the first wirings and the second wirings.

* * * * *

UNITED STATES PATENT AND TRADEMARK OFFICE
CERTIFICATE OF CORRECTION

PATENT NO.     : 6,624,492 B2
DATED          : September 23, 2003
INVENTOR(S)    : Kaneko et al.

It is certified that error appears in the above-identified patent and that said Letters Patent is hereby corrected as shown below:

<u>Title page</u>,
Item [57], ABSTRACT,
Line 4, change "wring" to -- wiring --.

<u>Column 10</u>,
Line 51, change "layer is comprises" to -- layer comprises --.
Line 64, change "layers" to -- layer --.

<u>Column 11</u>,
Lines 2 and 8, change "device" to -- devices --.

Signed and Sealed this

Second Day of December, 2003

JAMES E. ROGAN
*Director of the United States Patent and Trademark Office*